United States Patent [19]

Cranford, Jr. et al.

[11] Patent Number: 4,752,699
[45] Date of Patent: Jun. 21, 1988

[54] ON CHIP MULTIPLE VOLTAGE GENERATION USING A CHARGE PUMP AND PLURAL FEEDBACK SENSE CIRCUITS

[75] Inventors: Hayden C. Cranford, Jr., Apex; Stacy J. Garvin, Durham; Wendy K. Hodgin, Raleigh; John M. Mullen, Cary, all of N.C.

[73] Assignee: International Business Machines Corp., Armonk, N.Y.

[21] Appl. No.: 943,466

[22] Filed: Dec. 19, 1986

[51] Int. Cl.$^4$ ............................................. G05F 1/571
[52] U.S. Cl. ................................. 307/297; 307/200 B; 307/296 R; 307/494; 307/360; 363/60; 365/226
[58] Field of Search .................. 363/60; 365/184, 185, 365/226, 228; 361/90, 98; 307/200 B, 491, 494, 530, 351, 353, 354, 360, 246, 296 R, 297

[56] References Cited

U.S. PATENT DOCUMENTS

| | | | |
|---|---|---|---|
| 4,405,868 | 9/1983 | Lockwood | 363/60 X |
| 4,428,071 | 1/1984 | Wilmsmeyer | 307/297 X |
| 4,439,692 | 3/1984 | Beekmans et al. | 307/297 |
| 4,460,835 | 7/1984 | Masuoka | 307/296 R |
| 4,481,566 | 11/1984 | Hoffman et al. | 363/60 |
| 4,506,350 | 3/1985 | Asano et al. | 365/191 |
| 4,583,157 | 4/1986 | Kirsch et al. | 363/60 |
| 4,601,020 | 7/1986 | Arakawa et al. | 365/226 |
| 4,633,106 | 12/1986 | Backes et al. | 307/482 X |
| 4,638,464 | 1/1987 | Cranford, Jr. et al. | 365/226 |
| 4,673,829 | 6/1987 | Gupta | 365/226 X |

Primary Examiner—Stanley D. Miller
Assistant Examiner—D. R. Hudspeth
Attorney, Agent, or Firm—Joscelyn G. Cockburn

[57] ABSTRACT

A level selectable FET voltage generation system is described. The system includes a single charge pump controlled by multiple feedback paths and a power-down circuit. Each feedback path contains a capacitor divider network, a sense amplifier with a compensating voltage reference and a timer which periodically resets the capacitor divider network to insure sensing accuracy. The powerdown circuit and a selected feedback path provides a desired voltage level at the output of the charge pump.

8 Claims, 17 Drawing Sheets

ON CHIP MULTIPLE VOLTAGE GENERATION USING A CHARGE PUMP AND PLURAL FEEDBACK SENSE CIRCUITS

CROSS REFERENCE TO RELATED PATENT APPLICATION

The present application relates to U.S. Pat. No. 4,638,464 issued Jan. 20, 1987, entitled "Charge Pump System for Non-Volatile RAM," by H. C. Cranford et al, and assigned to the assignee of the present invention.

The Cranford et al application describes a multi-level high voltage system containing multiple charge pumps.

BACKGROUND OF THE INVENTION

1. Field of the Invention

The invention relates to voltage generation systems in general and, more particularly, to high voltage converters for converting logic level voltage signals to high voltages necessary for writing and/or erasing semi-conductor circuit devices such as E2PROM, etc.

2. Prior Art

The use of non-volatile memory systems has increased over the past few years. A typical non-volatile memory system includes a power generating system and a non-volatile memory system. The power generating system is usually integrated with the non-volatile memory system on a single chip. The non-volatile memory system is an array of floating gate memory cells which are written into and/or read by high voltage signals. The high voltage signals are generated by the power generating system.

The prior art provides several different types of power systems for driving non-volatile memory cells. Some of the prior art power systems are well suited for use with high voltage technology while others are suited for use with low voltage technology. In a high voltage technology, the power system devices can withstand relatively high voltage level signals without breaking down. This implies that the power supply system can be loosely controlled. However, in a low voltage technology the power system devices are sensitive to relatively high voltage and care must be taken to avoid breakdown of the devices. Because of the tight control which is designed into the power supply of the present invention, it allows low voltage technology devices to be used to generate high voltage.

Examples of prior art power supplies suitable for use with high voltage technology include U.S. Pat. Nos. 4,506,350; 4,404,475; 4,393,481; 4,186,436; 4,302,804; 4,368,524 and 4,263,664.

U.S. Pat. No. 4,506,350 provides a non-volatile semiconductor memory system with a boosting circuit for boosting a write voltage applied to the memory system. The boosting circuit includes an oscillator which accepts a stable write voltage of 5 volts and boosts it to a higher level.

U.S. Pat. No. 4,404,475 described a voltage generating circuit wherein an unregulated charge pump provides a high voltage pulse which is trimmed by a regulator circuit to provide a satisfactory voltage for driving a non-volatile memory integrated circuit.

U.S. Pat. No. 4,393,481 describes an on-chip high voltage generator having a charge pump and a capacitive sensing output circuit. A gated diode is used to set the maximum output voltage of the charge pump.

U.S. Pat. No. 4,186,436 describes an uncontrolled voltage generator which uses stacked capacitors to provide a high voltage.

U.S. Pat. No. 4,302,804 describes an unrelated d.c. voltage multiplier in which a four position sequential counter drives a charge pump composed of diodes and capacitors.

U.S. Pat. No. 4,368,524 describes a voltage generating circuit for an E2PROM. The generating circuit includes a charge pump which receives an externally generated +5 and +20 volts and boosts them to a desired operating level.

U.S. Pat. No. 4,263,664 described a voltage generating circuit with a charge pump which is controlled by a gated breakdown diode.

A voltage generating circuit which can be integrated with an electrically alterable high density semi-conductor memory is described in U.S. Pat. No. 4,481,566. The circuit is best suited for use in a low voltage technology. It includes a capacitive charge pump with a single feedback loop including a DETS (Dual Electron Injector Structure) device for controlling the charge pump. Processing techniques are used to enhance the voltage characteristics of the devices beyond normal technology breakdown limits.

SUMMARY OF THE INVENTION

It is therefore a general objective of the present invention to provide a more efficient high voltage generating system than was heretofore possible.

The improved voltage generating system uses a single charge pump with multiple feedback control paths to provide a plurality of distinct voltage levels at the output of the charge pump. Each feedback control path is designed for controlling a corresponding voltage level. Circuit techniques are used to prevent junction breakdown for voltages up to 30 V in a 5 V-only technology with a gated breakdown of 10 volts.

Each of the feedback paths includes a capacitor voltage divider network, a sense amplifierlifier network with compensating voltage reference and a timer which periodically resets the capacitors to ensure sensing accuracy. A powerdown network, with self-biasing of multiple devices to prevent junction breakdown, is used to discharge the output of the charge pump. An externally activated logic control circuit is used to select the active feedback path and/or the discharge path. A high frequency push-pull driver oscillator with power saving features produces two non-overlapping clock signals. These signals are used to drive the charge pump which is a chain of transistors connected as diodes and capacitors.

The foregoing features and advantages of this invention will be more fully described in the accompanying description of the drawings.

DESCRIPTION OF THE PREFERRED EMBODIMENT

Figure 1:
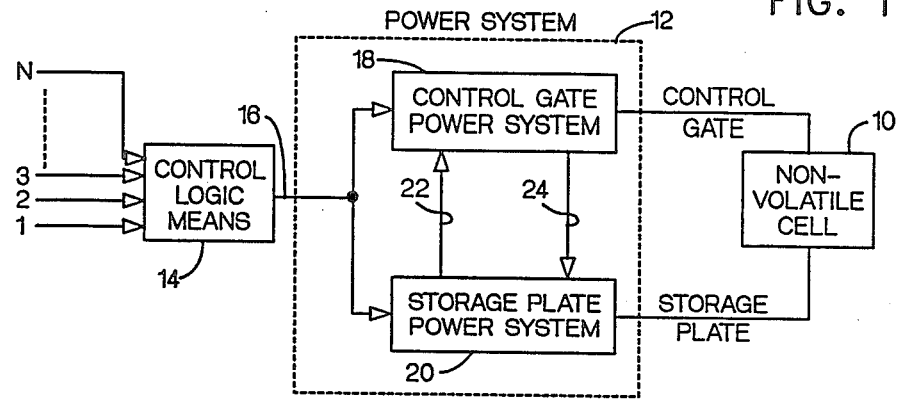
FIG. 1 shows a conceptual block diagram of a non-volatile memory chip with an on-chip voltage generating system.

FIG. 1 is a schematic for an electric, erasable, programmable road/only memory (E2PROM) system or non-volatile random access memory (NVRAM) system. The system includes a non-volatile cell, a power system 12 and a control logic means 14. The non-volatile cell is connected via a control gate conductor and a storage plate conductor to the power system 12. The power system 12 is connected via conductor 16 to the control logic means 14. A plurality of externally generated control signals are supplied on conductors 1-N. Depending on the signals which are activated, the control logic means 14 selects either control gate power system 18 or storage plate power system 20. The power system which is selected generates the necessary voltages for accessing the non-volatile cell 10. Communications between the control gate power system 18 and the storage plate power system 20 is provided by conductors 22 and 24, respectively.

Non-volatile cells are well known in the art. The function of such cells is to store data. Since these cells are well known, only those features of the cell which are necessary for an understanding of the present invention are described. The cell has a RAM plane of memory and a non-volatile (N-V) plane of memory. The RAM plane of memory allows normal RAM operations. It is independent of the N-V plane and is connected to the conductor labeled "storage plate." Signals on the storage plate conductor are provided by storage plate power system 20. This power system uses bootstrapping techniques to increase the 5 V supply voltage to an operational level between 7 and 8 volts.

The non-volatile plane is independent of the RAM plane and is used for non-volatile operations. The non-volatile plane supports an array of dynamic RAM cells. Each cell contains a floating gate and the two dual electron injection structure (DEIS) injectors which, when exposed to high voltage, conducts charge to or from the floating gate. The data is retrieved by sensing the presence or absence of the resulting depletion well. The volatile physical states are stored in potential wells and the non-volatile physical states are stored on floating gates. Control gate power system 18 provides the needed high voltages which allow data to be stored in and retrieved from the non-volatile background plane. It also maintains 9 volts on the control gate when the RAM plane is being used.

Figure 2:
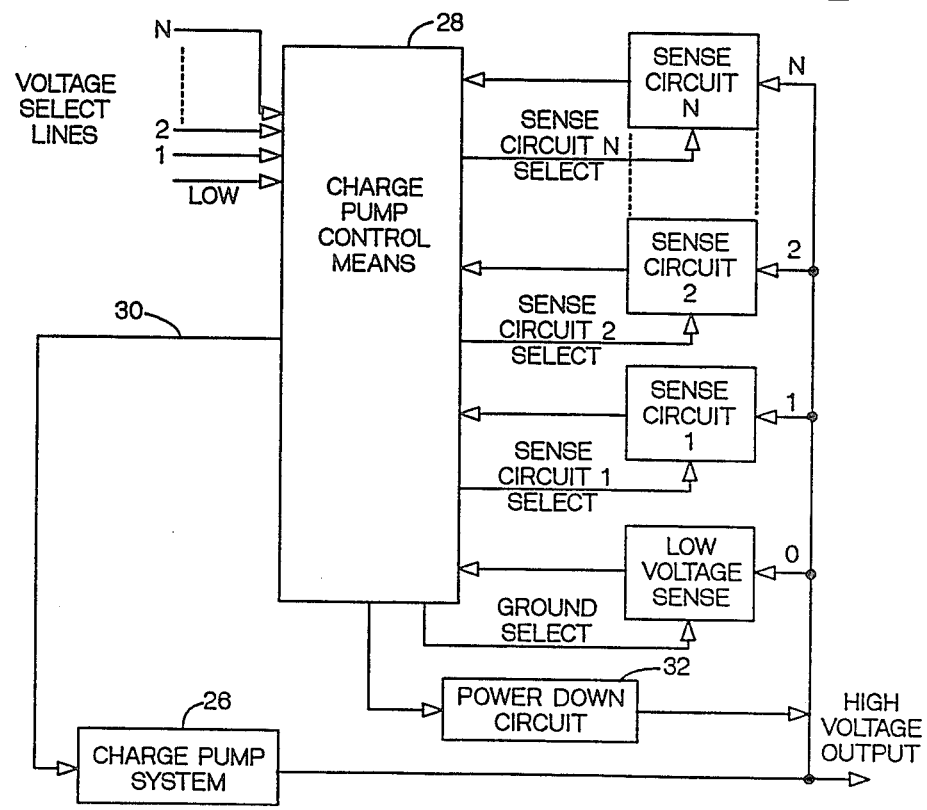
FIG. 2 shows a conceptual block diagram of an improved multiple level high voltage power generating system according to the teachings of the present invention.

FIG. 2 shows a block diagram of the control gate power system according to the teachings of the present invention. The control gate power system is a multiple level high voltage power system. By activating one of the voltage select lines Low and 1-N, a desired voltage signal can be extracted on the high voltage output line. The control gate power system includes a charge pump system 26. Charge pump control means 28 is connected by conductor 30 to the input of charge pump system 26 and is coupled via a plurality of feedback paths N through 0 to the output of the charge pump system. A sense circuit means is provided in each of the feedback paths. Thus, feedback path 0 includes low voltage sense circuit means 0, feedback path 1 includes sense circuit means 1 and so forth. A sense circuit select line interconnects each of the sense circuit means to the charge pump control means 28. For example, sense circuit means N is connected by sense circuit N select, sense circuit 2 is connected by sense circuit 2 select and so forth. Powerdown circuit means 32 interconnects the charge pump control means 28 to the output of charge pump system 26. As will be explained subsequently, each of the sense circuits is designed to provide a desired voltage level at the output of the charge pump system. Thus, when a particular sense circuit is selected and the powerdown circuit is activated, the powerdown circuit discharges the output of the charge pump while the sense circuit senses the charge on it. As soon as a charge falls within the setting of the sense circuit, the powerdown circuit is deactivated and the desired voltage is generated at the output of the charge pump.

Figure 3:
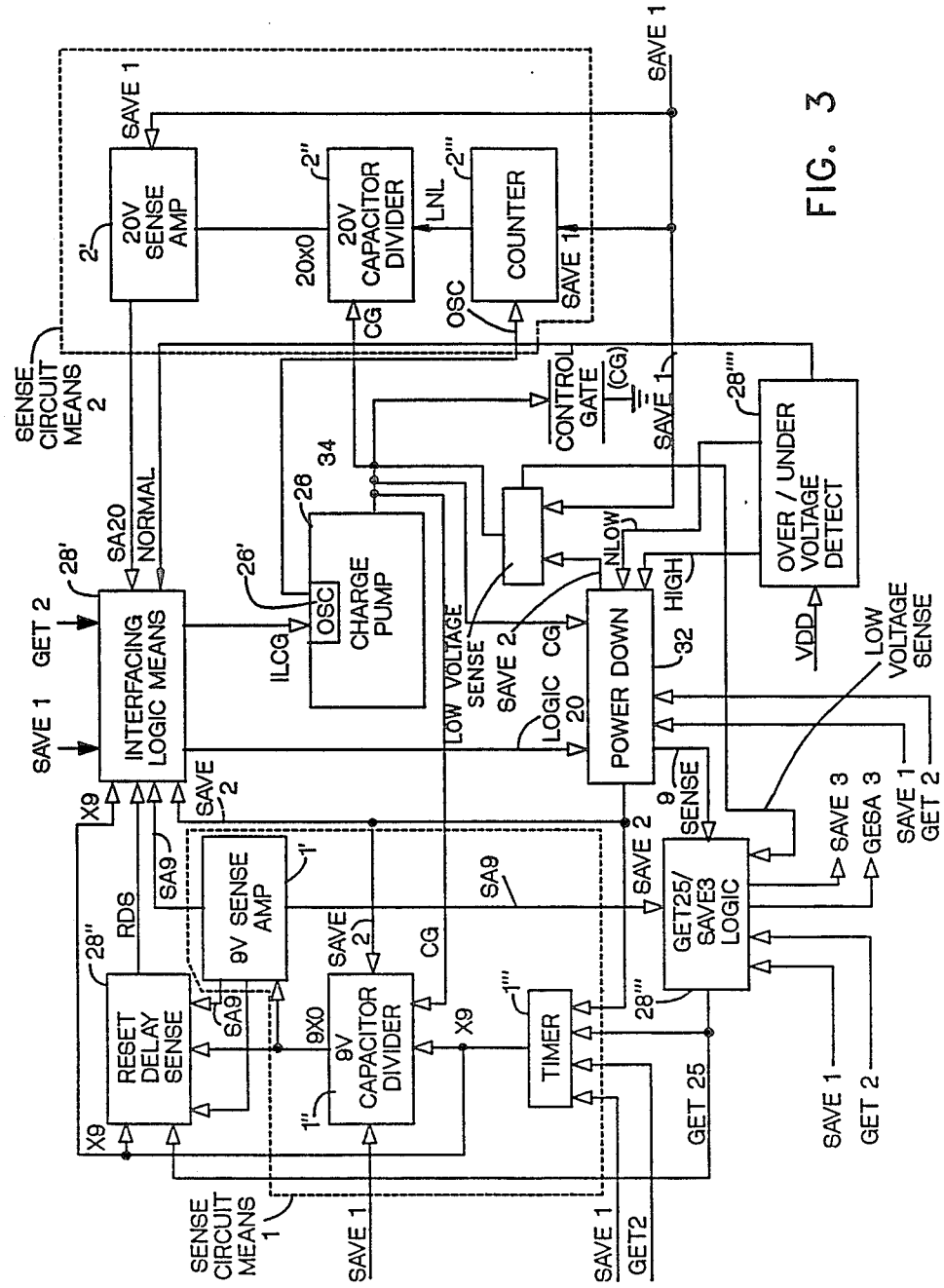
FIG. 3 shows a detailed block diagram of the multi-level high voltage power system.

FIG. 3 shows a detailed block diagram of the multi-level high voltage power system according to the teachings of the present invention. In order to simplify the description, common elements in FIG. 2 and FIG. 3 are identified by like numerals. Also, superscript notations are used to identify sub-components of similar elements. For example, sub-components of sense circuit means 2 are identified by numerals 2', 2" and 2'''.

Still referring to FIG. 3, the multi-level high voltage power system includes a two-phase oscillator 26' and charge pump 26". The oscillator is connected in series to the input of the charge pump. When the oscillator is activated, it pumps the charge pump until a desired voltage is sensed at output node 34. The oscillator is activated by the ILCG signal on the ILCG conductor. This signal is provided by interface logic circuit means 28'. Interface logic circuit means 28' is a sub-element of charge pump control means 28 (FIG. 2). The other sub-elements of charge pump control means 28 are reset delay sense (RDS) circuit means 28", Get25/Save3 logic circuit means 28''' and over/under voltage detect circuit means 28''''. The function which each sub-element of the charge pump control means 28 performs will be described subsequently.

Still referring to FIG. 3, the charge pump output node 34 is connected to the non-volatile plane of the non-volatile cell (FIG. 1). In FIG. 3 the non-volatile plane is represented by a capacitor labeled control gate (CG). In particular, the positive plate of the control gate is connected to node 34 and the negative plate of the capacitor is connected to a ground potential. Sense circuit means 2 is connected to output node 34. The function of sense circuit means 2 is to monitor output node 34 and generate a signal called SA20 when 20 V is sensed at said output node. To simplify the description, conductors are identified by corresponding signal names. Thus, SA20 identifies the conductor which carries signal SA20 and so forth. Sense circuit means 2 includes 20 V sense amplifier 2' 20 V switchable capacitor network 2″ and counter 2‴. The 20 V switchable capacitive network is connected to output node 34. The 20 V sense amplifier and the counter are connected to the 20 V switchable capacitive net-work. work. As will be explained subsequently, the capacitive divider network distributes the voltage at the output of the charge pump over a plurality of capacitors. The sense amplifier senses when 20 V is present and the counter under the control of the oscillator periodically resets the capacitors.

Still referring to FIG. 3, a low voltage sense circuit means is connected to output node 34. The function of the low voltage sense circuit means is to sense when the output node is at a relatively low voltage including ground potential. Sense circuit means 1 is also connected to output node 34. Sense circuit means 1 senses when the output node 34 and the control gate is at 9 V. It then sends the SA9 signal on the SA9 conductor. Sense circuit means 1 includes 9 V sense amp 1′, 9 V switchable capacitor network 1″ and timer 1‴. The 9 V switchable capacitor network 1″ is connected to output node 34. 9 V sense amplifier 1′ and timer 1‴ are connected to the 9 V capacitor divider network. Power-down circuit means 32 is connected to output node 34. When activated, it discharges output node 34 and the control gate to a desired voltage level.

The over/under voltage detect means 28″″ monitors the supply voltage Vdd and transmits control signals if the voltage deviates from a predetermined value. In the preferred embodiment of this invention, Vdd is 5 V 10%. Reset delay sense circuit means 28″ controls the interface logic means 28′ so that the output from 9 V sense amp 1′ is ignored during much of the time when the 9 V capacitor divider network is reset. Finally, the Get25/Save3 logic circuit means generates control signals that allow the RAM plane to retrieve data from the floating gate when the control gate is at a ground potential. The lines labeled Save1 carry the save command which is generated externally. These lines become active when information on the dynamic RAM plane is to be loaded in the background or non-volatile plane. Also, when information is to be removed from the non-volatile plane to the dynamic RAM plane, the signal lines labeled Get2 are activated. Other interconnecting lines in FIG. 3 are labeled with the name of the sub-component that generates them. Thus, Save3 and GESA3 are generated from the Get25/Save3 logic circuit means 28‴. Even though the preferred embodiment covers the case where 0, 9 and 20 V are provided at the output node 34, this should not be construed as a limitation on the scope of the present invention since it is well within the skill of an artisan to utilize the teachings of this invention to provide fewer or more voltage levels at output node 34. Also, the value of the voltage levels may differ from the values given in the present invention. Having described the multi-level voltage generating system, a detailed description of the components of FIG. 3 will now be given.

Charge Pump and Oscillator Circuit

The charge pump and oscillator circuit provide high voltages at output node 34 which are transmitted to the control gate (FIG. 3). The circuit is comprised of oscillator 26′ and charge pump 26″. The output of the two-phase oscillator is connected to the input of the charge pump. Such oscillator and charge pump combination is well known in the art; therefore, a detailed description of either the oscillator circuit or the charge pump circuit will not be given. Suffice it to say that the charge pump consists of a series of 16 stages of 12 picofarad (Pf) capacitors and diode structures. Each bootstrap capacitor is essentially a depletion device with the drain electrode and the source electrode connected. The bootstrapping action charges each node successively higher. The final output voltage ranges between 20 and 24 V.

The charge pump provides loading for phase 1 and phase 2 of the oscillator. Once the proper output voltage has been reached, as indicated by one of the sensed amplifiers, the ILCG signal goes low, turning off the oscillator and floating all nodes high except for the feedback node. As a result, the charge pump is turned off with a desired voltage at output node 34. An example of a charge pump/oscillator combination which can be used in the present invention is described and shown in the above referenced patent by Cranford et al and is incorporated herein by reference.

Sense Circuit Means

Figure 4A:
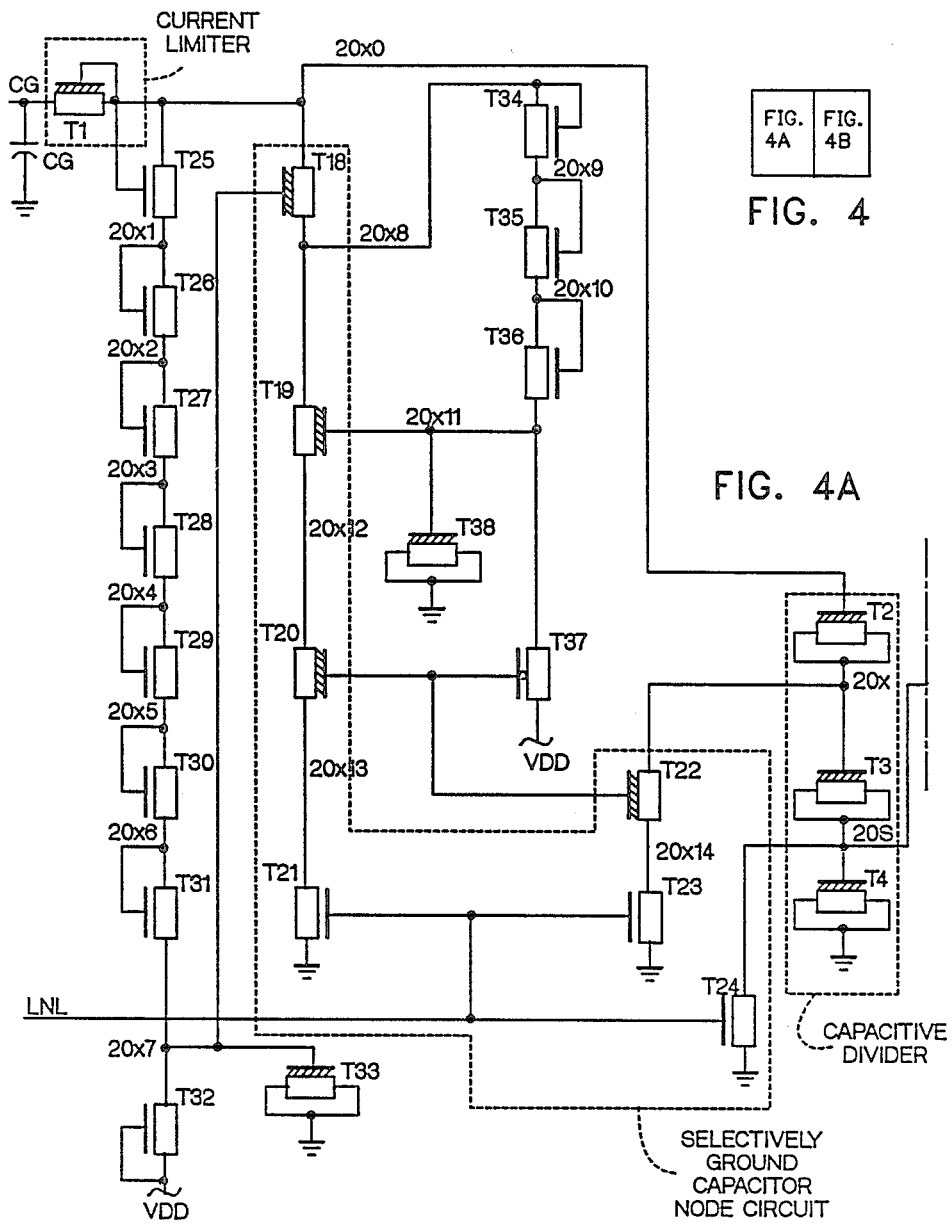
FIG. 4 (comprising FIGS. 4A and 4B) shows a circuit diagram for a 20 V sense amplifier circuit means.
Figure 4B:
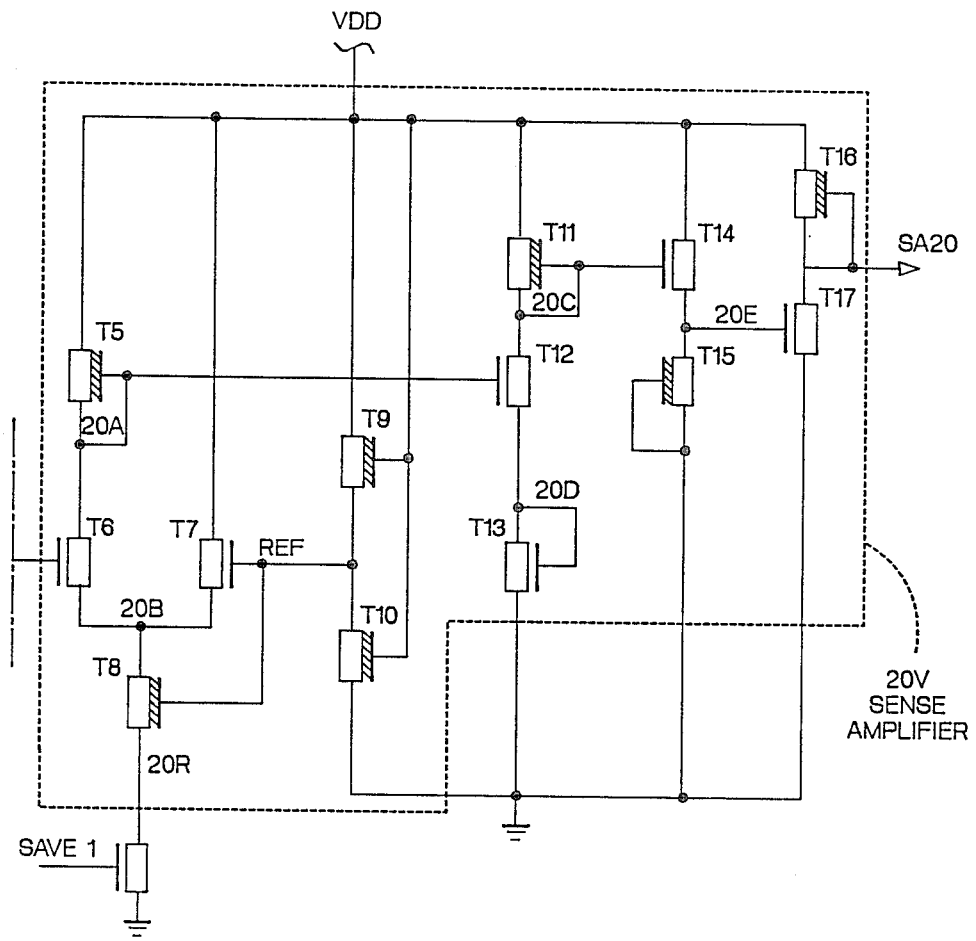
Figure 5A:
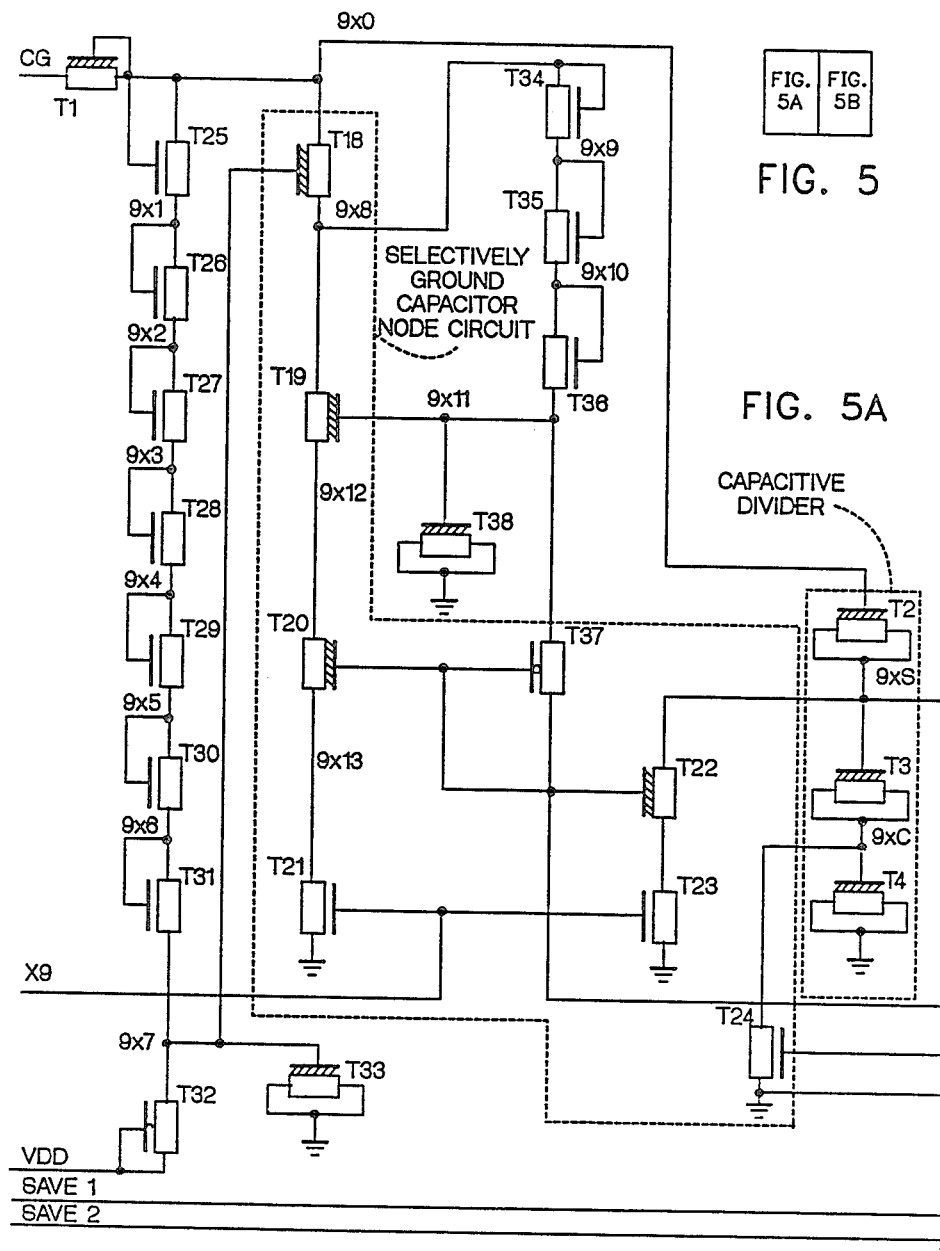
FIG. 5 (comprising FIGS. 5A and 5B) shows a circuit diagram for a 9 V sense amplifier circuit means.
Figure 5B:
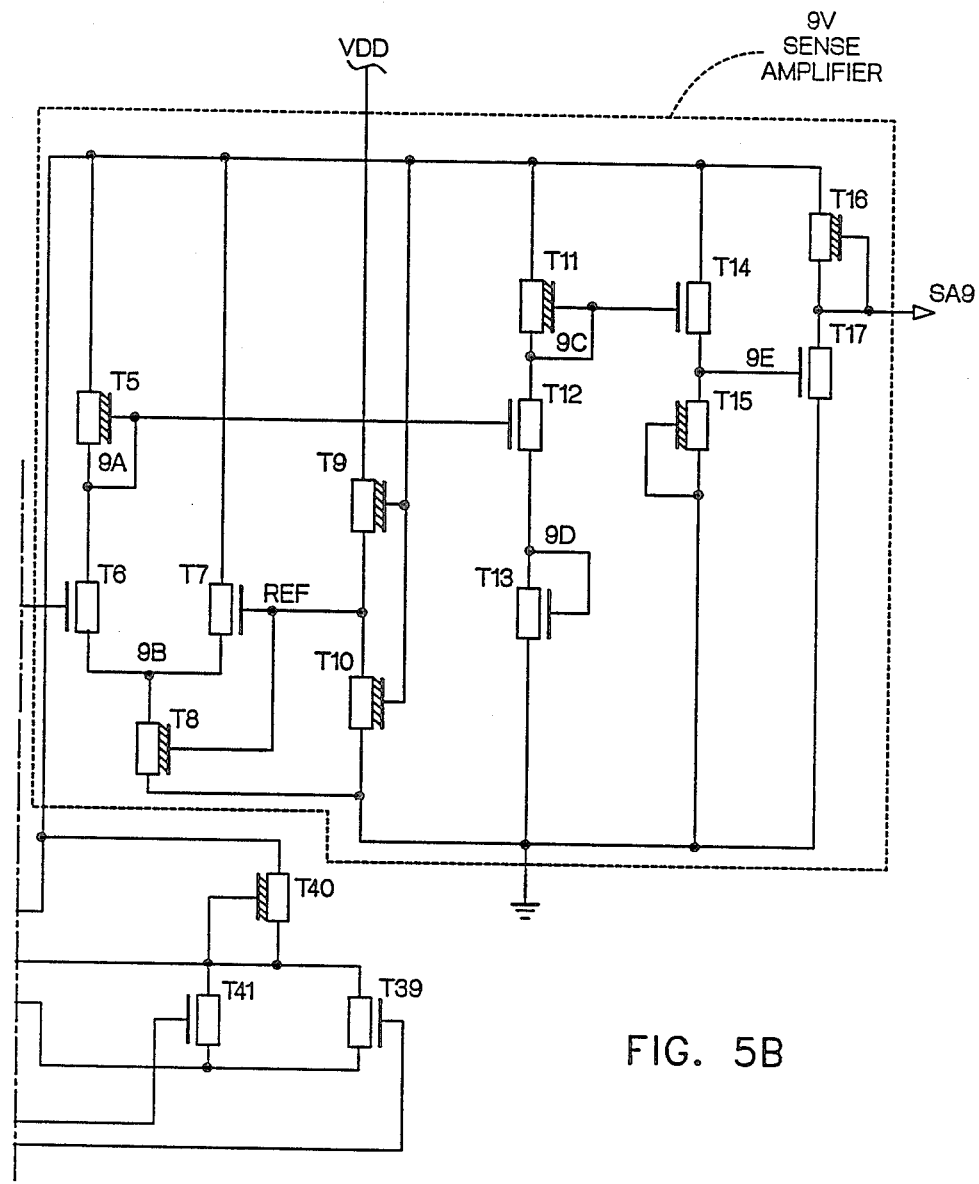

FIGS. 4 and 5 show circuit schematics for the sense circuit means. In particular, FIG. 4 shows the circuit schematic for sense circuit means 2 (FIG. 3) and FIG. 5 shows a circuit schematic for sense circuit means 1 (FIG. 3). As stated previously, the circuit arrangement in FIG. 4 senses when a charge of 20 V is on the control gate and transmits a control signal SA20 on the conductor labeled SA20. Similarly, the circuit arrangement in FIG. 5 monitors output node 34 (FIG. 3) and sends a signal on the conductor labeled SA9 (FIG. 5) when 9 V are sensed on the control gate. Similar circuit arrangements are used for sensing the 9 V and 20 V, respectively. Therefore, common devices in FIGS. 4 and 5 are identified by like alphanumeric characters. The circuit arrangements in FIGS. 4 and 5 are fabricated from FET devices. Depletion mode devices are identified with cross-hatching between the gate electrode and the body of the device. Likewise, enhancement mode devices do not have cross-hatching between the device gate electrode and its body.

Depending on the current state of operation, the control gate (FIG. 3) must be taken to different voltage levels. During normal volatile operation, the control gate must be maintained at +9 V. This requires periodic pumping to achieve and maintain this level. Also, the same charge pump must be able to charge the control gate to +20 V during a save operation. Thus, both the +9 V and the +20 V levels must be sensed in order to shut off the charge pump at the correct point. To effectuate this result, the sense amplifiers in FIGS. 4 and 5 constantly monitor the control gate through their respective capacitor divide networks in order to prevent them from high voltage breakdown.

Still referring to FIGS. 4 and 5, the networks sense when the control gate is at 20 V and 9 V, respectively, and subsequently disable the charge pump. Device T1 is a current limiter that prevents the control gate from being affected when the capacitor nodes are grounded. Devices T2, T3 and T4 comprise a capacitor divider that steps down the control gate voltage to a safe level for sensing.

Leakage current will discharge the capacitors over time and at different rates. This makes it necessary to periodically ground the capacitor nodes and allow them to be recharged by the current limiting device T1.

Devices T5–T17 form the sense amp with level shifting to provide a clean output signal. In particular, devices T9 and T10 provide an internal reference node. The signal on the reference node is amplified by devices T5, T6, T7, T8 (T5-T8). The level shifting function is provided by devices T11, T12, T13, T14, T15, T16, T17 (T11-T17).

Devices T18-T24 provide paths for selectively grounding the capacitor nodes while protecting against high voltage breakdown.

When it is necessary to reset the capacitor divider (the LNL or X9 signal is taken to 5 V. This turns on devices T21, T23 and T24, providing current paths through which the nodes are discharged. When LNL or X9 is low, devices T21, T23 and T24 are off and the control gate voltage is split across the capacitors in such a way that device breakdown does not occur.

Devices T25-T38 are biasing diodes and capacitors. These devices provide the proper gate voltages on the aforementioned powerdown devices to ensure equal voltage drop across each. Each diode is in a configuration with drain connected to gate. This limits the voltage at the source of the device to a threshold voltage below the drain voltage. These diodes are then used to step down the high voltages and to bias the gates of devices T18 and T19 so as to limit the drain to source voltages of these devices to acceptable levels. Devices T25-T31 form the diode biasing network for T18. Device T32 and capacitor T33 form a clamping network which insures that T18 does not turn off due to negative capacitive coupling during the powerdown cycle. Devices T34-T36 form the diode biasing network for T19. Device T37 and capacitor T38 form a clamping network that insures that T19 has sufficient gate to source drive in spite of negative capacitive coupling during the powerdown cycle. The gates of devices sT20 and T22 are biased by $V_{dd(+5V)}$. This is sufficient to prevent breakdown of these two devices since their drains are subjected to lower voltages than the drains of T18 or T19. The biasing networks limit the drain to source voltages of any of the current carrying devices in the powerdown path to acceptable levels.

Device T81 (FIG. 4) is a power saving feature which simply floats the 20 V sense amplifier when it is not in use. The line labeled LNL (FIG. 4) is the output of the counter which resets the switched capacitors at the commencement of a save cycle.

With reference to FIG. 5, the power saving feature is provided by devices T40, T41 and T39. The circuit (FIG. 5) senses +9 V by grounding the gate of capacitor T4; thus, effectively dividing the control gate potential across capacitors T2 and T3, respectively. During a save cycle, capacitor T4 is included, capacitor T4 is included in the capacitor stack to prevent breakdowns resulting from too much potential across any one capacitor or the input to the sense amplifier. X9 is the reset signal from timer 1''' (FIG. 3) that periodically resets the switched capacitors of the sense 9 circuit.

Low Voltage Sense Circuit Means

Figure 10:
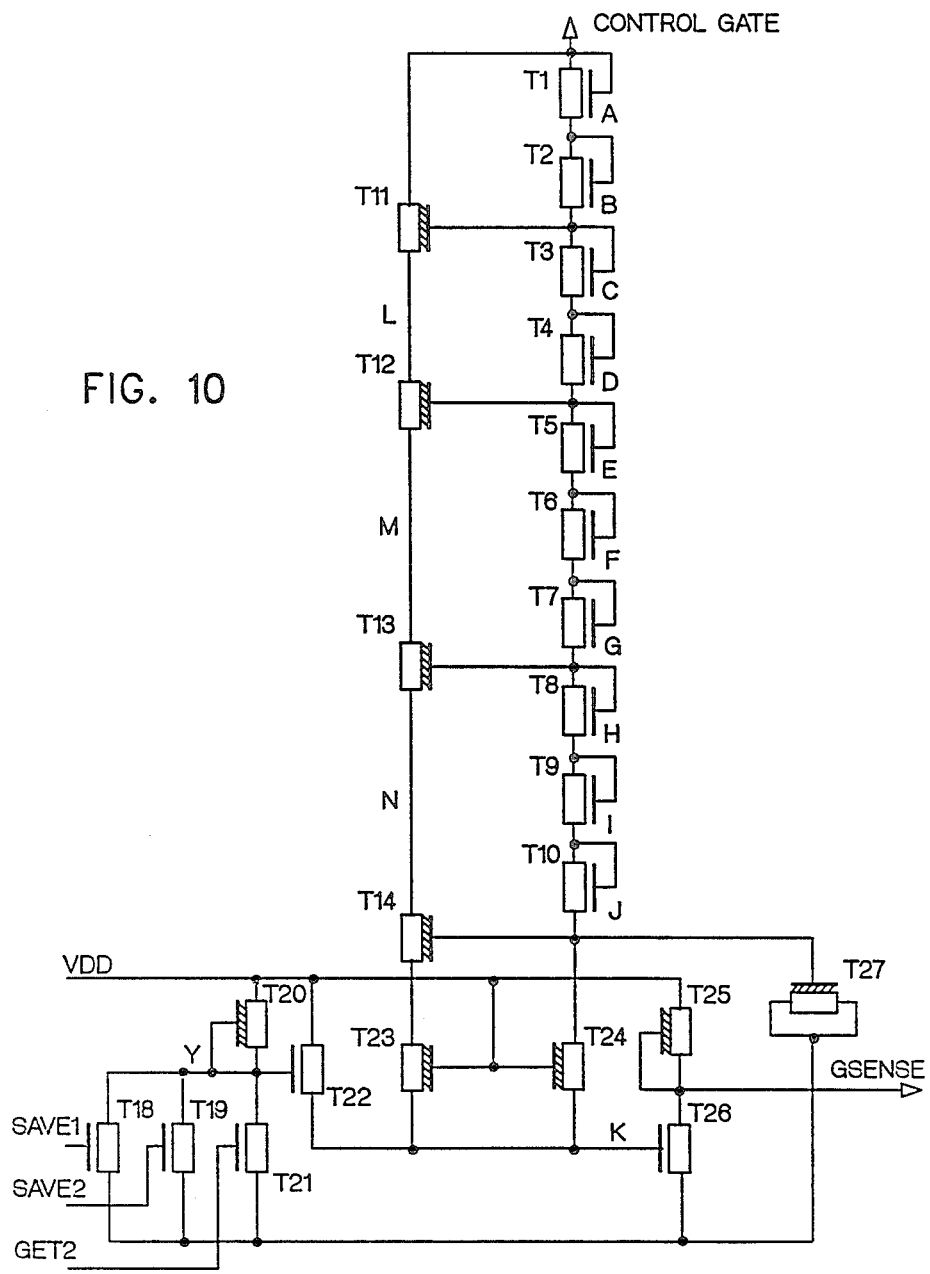
FIG. 10 shows a circuit diagram for a low voltage sense circuit.

FIG. 10 shows a schematic of the low voltage sense circuit means. The low voltage sense circuit means monitors the control gate and transmits the signal Gsense when the control gate is within a threshold of ground after a get cycle has begun. The circuit is controlled (that is, turned on and off) by FET devices T18, T19, T20, T21 and control signals Save1, Save2, and Get2. To activate the circuit Save1, Save2 or Get2 is taken to 5 V. When the control gate is at its maximum level, diodes T1-T10 provide biasing for T11-T14 such that no one device has more than 10 V across it. As a result, snapback and sustaining voltages are avoided. Each diode is formed from an enhancement mode device. The biasing is dependent on the threshold voltage of each enhancement device.

Devices T11-T14 and T23 provide a current path between the control gate and sense node K. Sense node K is clamped to a depletion threshold above Vdd by device T24. As the control gate falls below this clamping voltage, node K tracks, allowing the inverter formed by devices T25 and T26 to switch at approximately 1 V. The inverter switch point can be closely controlled by controlling the width to length ratios of devices T25 and T26, respectively. It is desirable that the inverter formed by devices T25 and T26 has a low switch point and provides a relatively fast rise time for G sense. However, a low switch point usually results in a relatively slow rise time for Gsense and vice versa. These two opposing criteria are controlled by limiting the loading on Gsense.

The gates of depletion devices T23 and T24 are tied to Vdd to assure maximum current flow. This configuration also clamps node K to a depletion threshold above Vdd and protects device T26 from breakdown. The source and drain of device T27 are connected together to form a capacitor between node J and ground potential. This capacitor prevents bootstrapping between capacitively coupled node J and node N which prevents node J from rising to a high voltage level. Device T22 maintains the voltage at node K above a device threshold prior to the rise of the control gate to its 20 V level. A device T22 is necessary since node K will not have been charged high enough to keep T26 turned on until the control gate gets above +9 V. The ground sense circuit is disabled when node Y is at its up level.

Interface Logic Circuit Means

Figure 11:
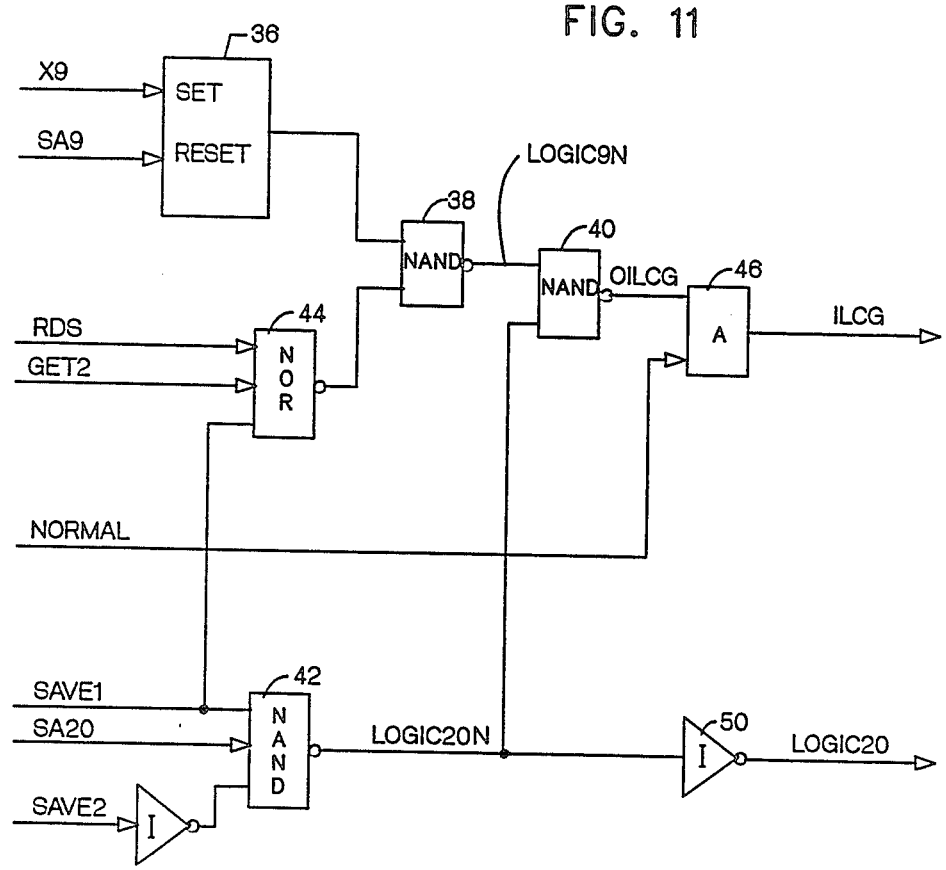
FIG. 11 shows a logic diagram for an interfacing logic means.

FIG. 11 shows a logic diagram for interface logic circuit means 28' (FIG. 3). The interface logic diagram generates signals Logic20, Sense, Logic9, and ultimately ILCG. Logic9 or Logic20, along with the signal labeled NORMAL, will permit ILCG to control the oscillator which drives the charge pump. The interface logic circuit means includes latch 36, NAND gates 38-42, NOR gate 44, AND gate 46 and inverters 48 and 50.

The signal on the line labeled Logic20 is high if the signal on the line labeled Save1 and SA20 are high and Save2 is low. At the beginning of a save cycle, if the signal Logic20 is high, then the charge pump pumps to +20 V. SA20 falls when the proper voltage level is reached on the control gate. As a result, Logic20 is dropped and the charge pump is disabled. Save2 then goes high and prevents any further pumping during the save cycle. The signal Logic 20 is also provided to the powerdown network (to be described hereinafter). The signal Sense on the line labeled Sense is generated by latch 36. The latch is set by the signal on the line labeled X9 and is reset by the signal on the line SA9. The latch produces the signal Sense which is taken to 5 V with the set signal X9 and remains high for a certain amount of time after the fall of X9. The signal SA9 goes low when the control gate is at its desired voltage level. It should be noted that the only time that the sense amplifier samples the control gate is immediately after a capacitor reset signal, corresponding to Sense high.

The fall of the signal Get2 on the line labeled Get2 indicates that the control gate is to be returned to 9V from the 0V level present during the Get cycle. The signal logic 9 on the line labeled logic 9 is then generated with either Sense high or the fall of the signal Get2. This in turn sets ILCG high and enables the charge pump to pump from a 0V level to +9 V during normal operation. If either logic 9 or Logic 20 and NORMAL are true, then ILCG is high. If NORMAL is low, then the charge pump is disabled even if logic 9 or Logic 20 is high. Logic 9 and Logic 20 are never true at the same interval.

Get25/Save3 Logic Circuit Means

Figure 12:
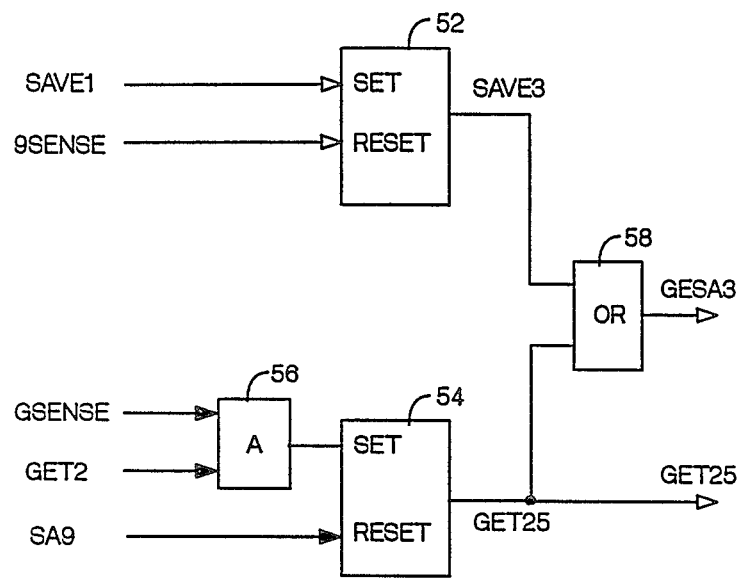
FIG. 12 shows a logic diagram for a Get25/Save3 logic circuit means.

FIG. 12 shows a schematic of the Get25/Save3 logic circuit means. The logic circuit means is comprised of latches 52, 54, and circuit 56 and OR circuit 58. The function of the Get25/Save3 logic circuit means is to generate Get25, Save3 and GESA3 signals.

With reference to FIG. 3 for the moment, Get25 is sent to the Relay Delay Sense circuit and to the timer in conjunction with the external Get2 signal. Get2 and Get25 combined span the entire get cycle. Likewise, Save1 and Save3 is high.

Get25 is a signal generated by the Get25/Save3 logic circuit means. Its rising edge indicates that the control gate has been pulled to ground and indicates by its falling edge that the control gate has been pumped back to +9 V at the end of the get cycle. With reference to FIG. 12, Get25 is latched high by signals GSense and Get2. When GSense falls, Get25 is maintained at +5 V until reset by the falling edge of SA9. Get25 falls when SA9 falls indicating that the control gate has been restored to +9 V.

Save3 indicates by its rising edge that a Save1 up level has been received and by its falling edge that the control gate has successfully powered down to the +9 V operating level at the end of the save cycle. Save3 is generated to communicate with the RAM plane. It is produced by latch 52 when Save1 is high. Save3 is pulled low when 9 sense goes high, indicating that the control gate is again at +9 V operating level. GESA3 is high if and only if either Save3 or Get25 is high and is utilized by the RAM plane. Save3 and Get25 are never true at the same time.

Overvoltage/Undervoltage Detection Network

Figure 13:
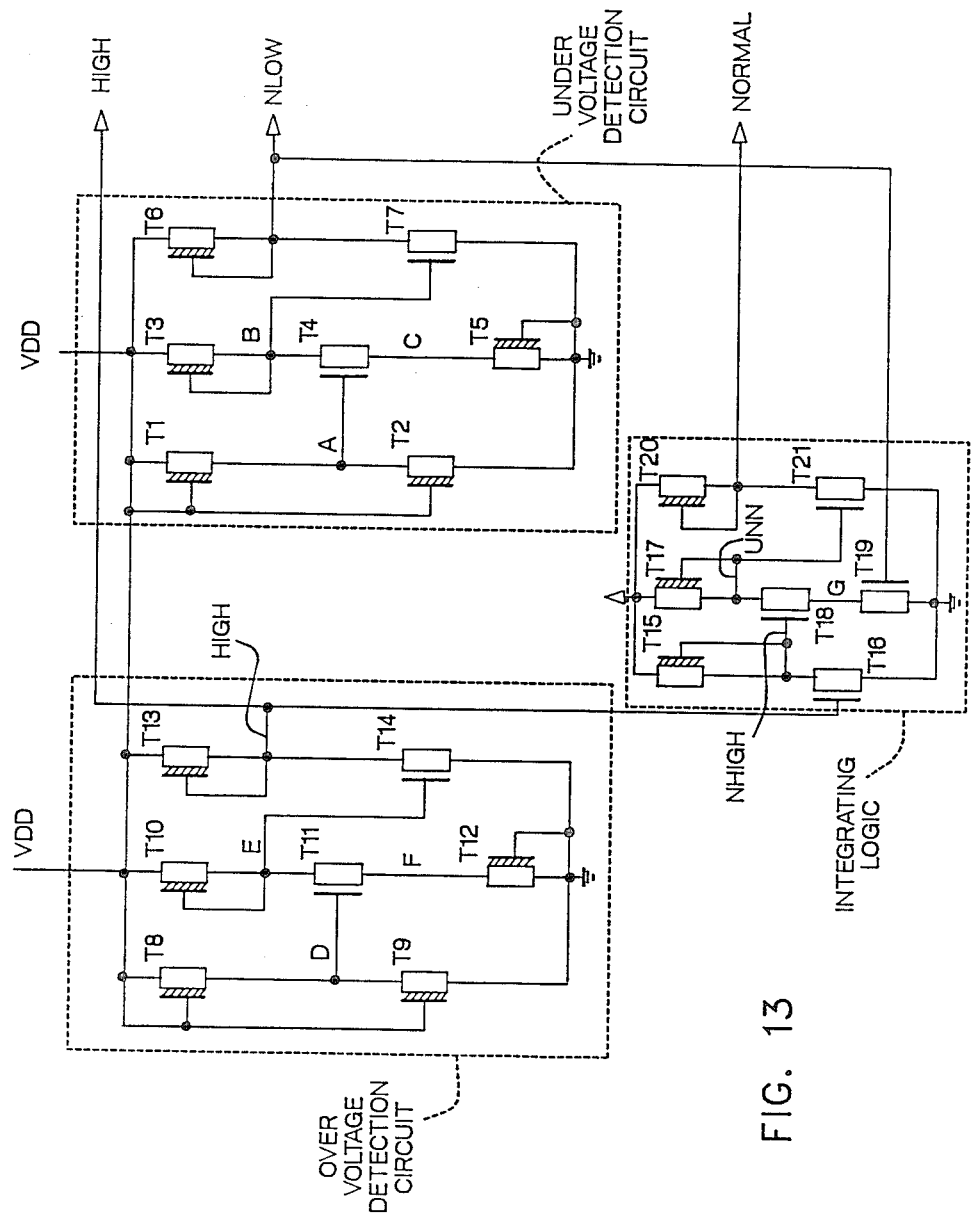
FIG. 13 shows a circuit diagram for an over voltage/under voltage detect circuit.

FIG. 13 shows a circuit diagram for the overvoltage/undervoltage detect circuit. The circuit monitors the supply voltage Vdd and outputs a signal labeled NORMAL when the voltage is above or below a predetermined level. In the preferred embodiment of this invention the level is 5 V. The circuit is comprised of an undervoltage detection circuit formed from FET devices T1–T7, overvoltage detection circuit formed from FET devices T8–T14 and an integrating logic circuit formed from devices T15–T21.

It is necessary to detect a power supply undervoltage condition so that the chip function may be shut down in an orderly manner. If this condition occurs during a non-volatile save operation, the control gate must be brought low to prevent writing erroneous data from the cell. It is also necessary to sense when the power supply is above a given level so that certain circuits may be disabled, thereby preventing junction breakdown and a catastrophic failure. This is necessary for any circuit that contains bootstrapped nodes which are normally boosted to a voltage just below junction breakdown. An overvoltage detect circuit and an undervoltage detect circuit are combined to produce the NORMAL signal which is high when the power supply is within normal operating range and goes low if Vdd rises too high or falls too low.

Except for the switching levels set by depletion mode devices T1 and T2 of the undervoltage detection circuit and T8 and T9 of the overvoltage detection circuit, the operation of the detect circuits is similar. Thus, only the operation of the undervoltage detect circuit will be described. It being understood that the overvoltage detect circuit operates in a similar manner. In this regard, depletion mode devices T8 and T9 (overvoltage detection circuit) perform the same functions as depletion mode devices T1 and T2 (undervoltage detection circuit). Similarly, devices T10, T11 and T12 (overvoltage detect circuit) perform the same function as devices T3, T4 and T5 (undervoltage detection circuitry). Finally, devices T13 and T14 (overvoltage detection circuit) perform the same function as devices T6 and T7 (undervoltage detection circuitry). Still referring to FIG. 13, devices T1 and T2 are biased in the linear region and form a voltage divider. As Vdd increases, node A rises. When node A rises above the sum of VT4 and V5, device T4 switches to an on state. Node C rises to a voltage determined in part by the ratio of the width to length of devices T3 and T5. When node B falls below an enhancement threshold, device T7 switches off and the output, NLOW, rises indicating the Vdd is above the level determined by the divider network formed by devices T1 and T2. Thus, the actual switch point of the undervoltage detection circuit is determined by the level set by devices T1 and T2 and its relationship to V5. The effects of the threshold voltage variation can be largely negated by the selection of device sizes. The thresholds of devices T1, T2, and T5 track. Thus, V5 will be higher when V2 is higher and lower when V2 is lower. This tracking of V2 and V5 compensates for the threshold voltage variation and maintains a constant switch point. This provides a highly accurate overvoltage or undervoltage sense level.

Powerdown Network

The powerdown network discharges the control gate. The control gate, during normal operation, is either discharged from +20 V to +9 V after a save operation or from +9 V to ground at the start of the get operation. However, if normal operation is lost, either due to overvoltage or undervoltage detection, then the powerdown circuit is enabled by means of the powerdown logic circuit. The powerdown circuit also generates a 9 V sense signal, labeled 9Sense (FIG. 3), when the control gate voltage level has reached approximately +9 V, thus disabling the powerdown paths. The rise of 9 sense is utilized by the Get25/Save3 logic circuit means to reset the latch which causes Save3 to go low indicating the end of the save cycle.

Still referring to FIG. 9, multiple devices are used in the discharge path along with the series of diodes to provide proper biasing. Capacitors are used on the gates of devices 48 and 55 to counteract the effects of negative bootstrapping as the control gate discharges. During normal operation, the control gate is pumped to 20 V when the signal Save1 on the line labeled Save1 and the signal Logic 20 on the line labeled Logic 20 rises. The 9 Sense circuit consists of a series of diodes T1–T5, T7–T10, T12–T14, T16–T17, T19, and T1A–T14A used to bias depletion devices T11, T15 and T18. These diodes charge the gates of device T25 to a predetermined level. During save, the signal labeled Save2 is latched high when the signal Logic 20 falls. This latch consists of devices T32-T37. As Save1 falls, this enables Pdown to go high. As Pdown goes high, the path to ground is completed to discharge the control gate. Once the control gate is approximately 9 V, the gate of device T25 discharges and node labeled 9SenseU goes to its up level. Simultaneously, the latch formed by devices T32-T37 latches 9Sense. This in turn allows Psense then to pull Pdown low, disabling the powerdown circuit which leaves the control gate at 9 V level. At the start of a get cycle, signal Get2 causes node Pdown to go high. The powerdown circuit is then used to pull the control gate to ground. Node Pdown goes low when signal Get2 goes low to allow the control gate to be pumped back to 9 V.

The overvoltage/undervoltage detect circuit previously described sets signal Nlow and HIGH falls during normal voltage ranges. If Vdd goes below 3.5 V, then signal Nlow goes low and signal Pdown is enabled. The gate of device T58 labeled Pdown (FIG. 9) is held high by trapping charge with capacitors T60 and T62 in the case of undervoltage. If Vdd goes above 6.5 V, the signal labeled HIGH goes to its true state. Signal HIGH is an input to a NAND gate formed from devices T76-T79. Signal labeled Pdown is enabled in an overvoltage situation only if the signal labeled Logic 20 and the signal labeled HIGH are true. This occurs only at the start of a save cycle when the control gate is still below +20 V. The control gate will then be powered down as soon as Vdd goes above +6.5 V and thus aborts the save operation. The powerdown network resumes normal operation only if an Nlow is high and the signal HIGH is in its low state as controlled by the overvoltage/undervoltage detect circuit.

Counter Circuit

Figure 8A:
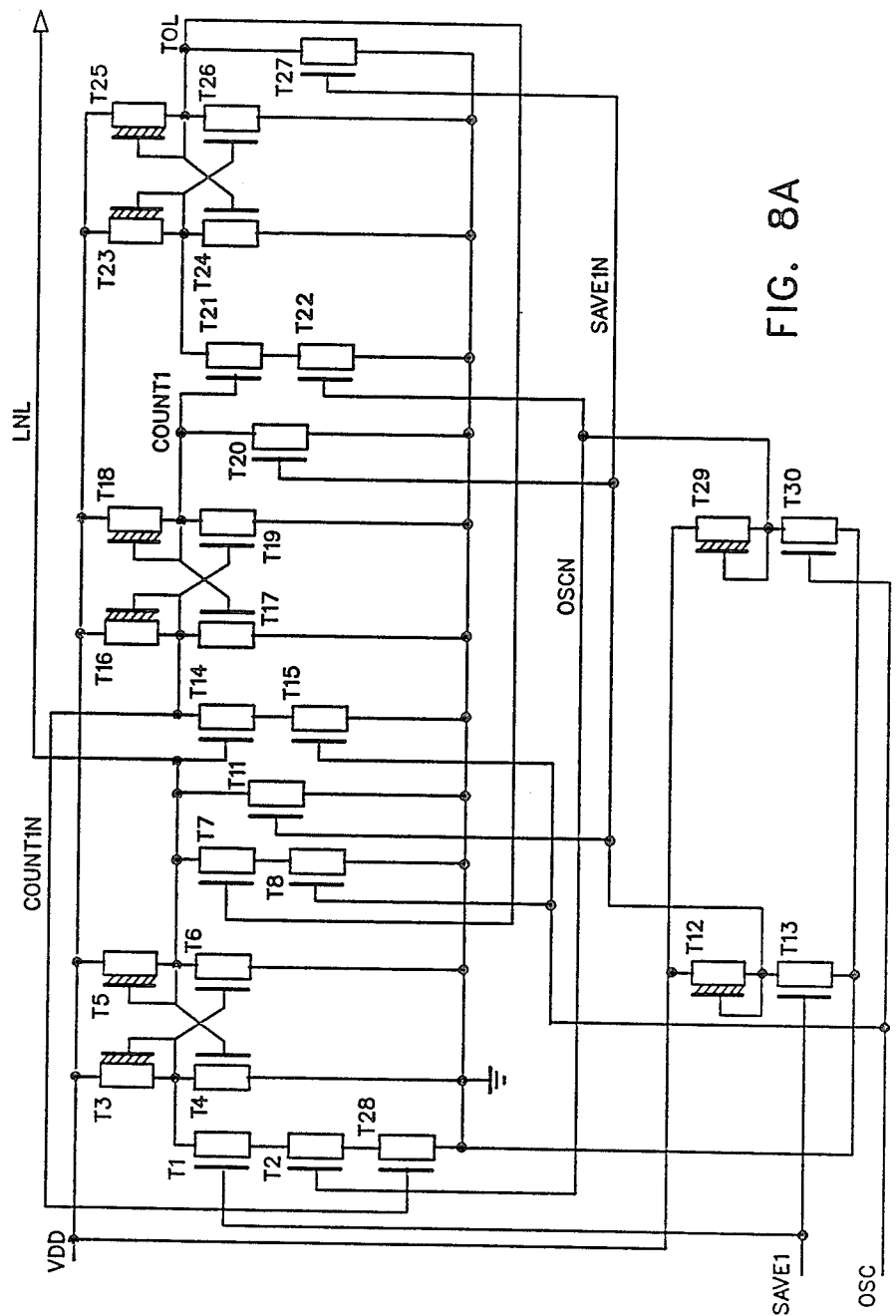
FIGS. 8A and 8B show a circuit diagram and timing diagram for a counter.
Figure 8B:
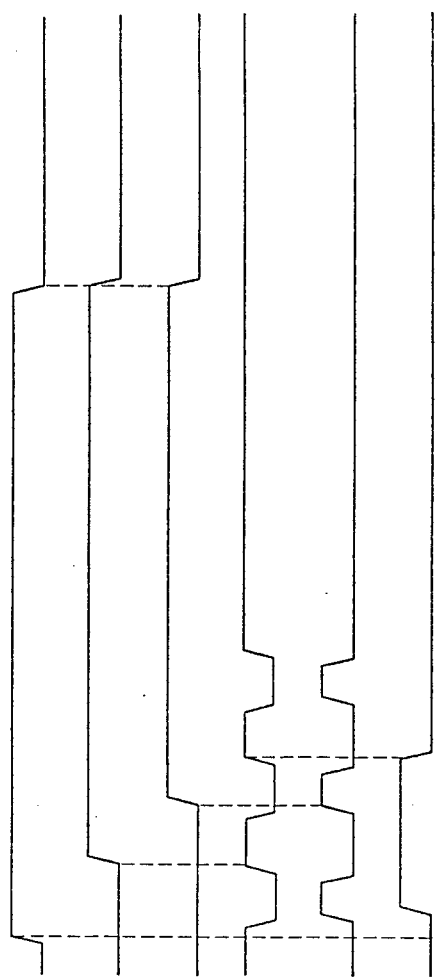
Figure 9A:
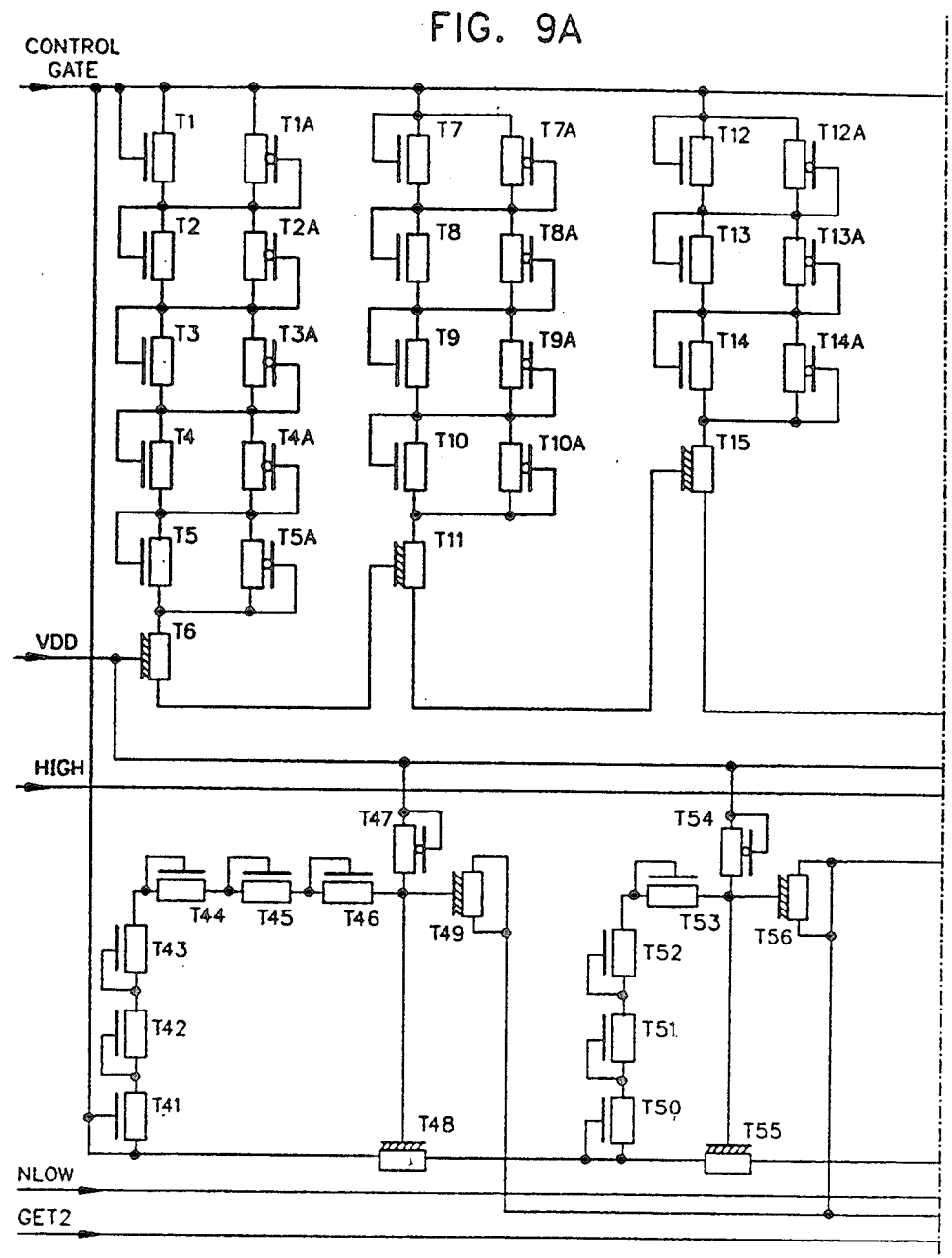
FIG. 9 (comprising FIGS. 9A, 9B and 9C) shows a circuit diagram for a power down network.
Figure 9B:
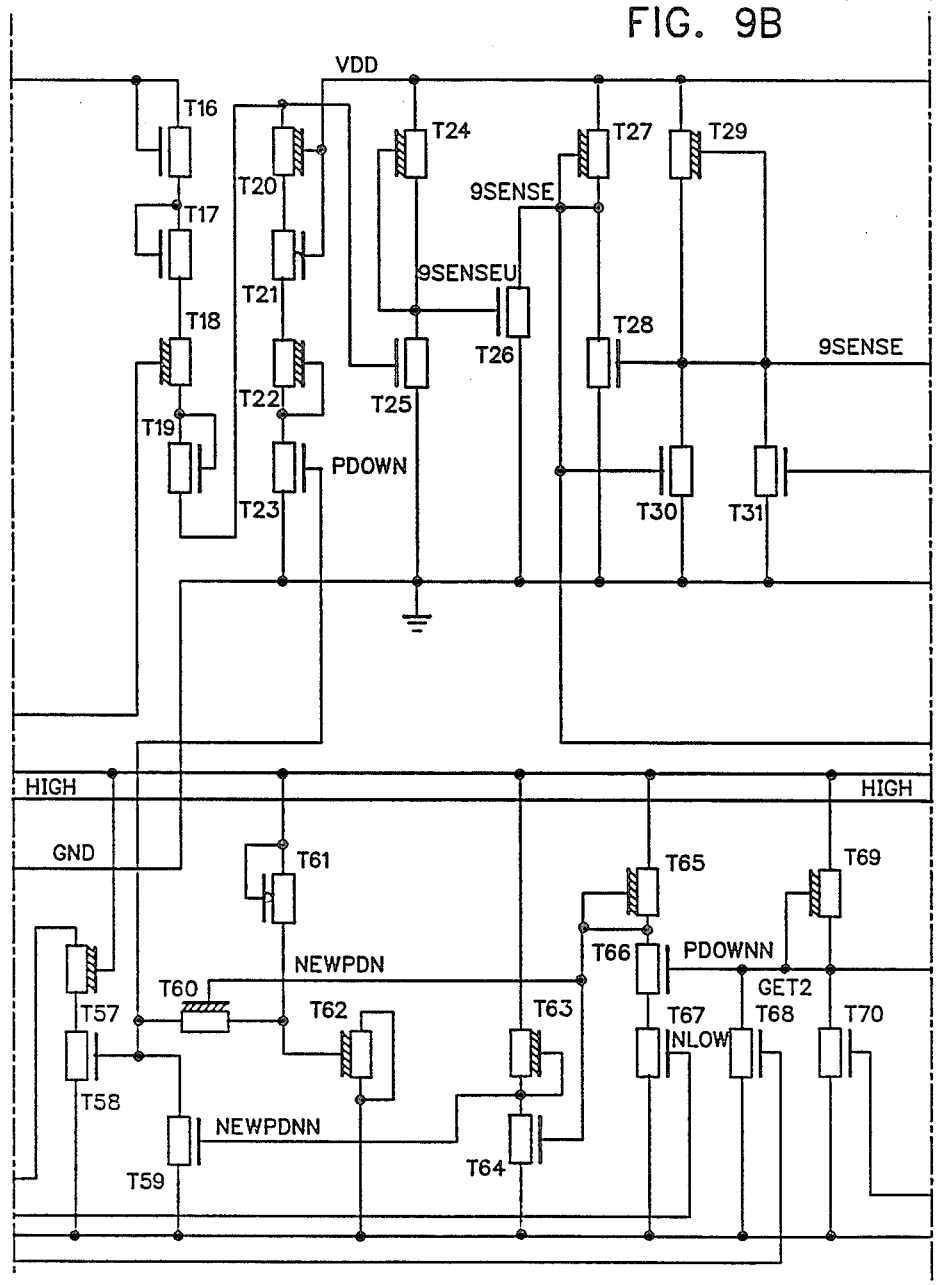
Figure 9C:
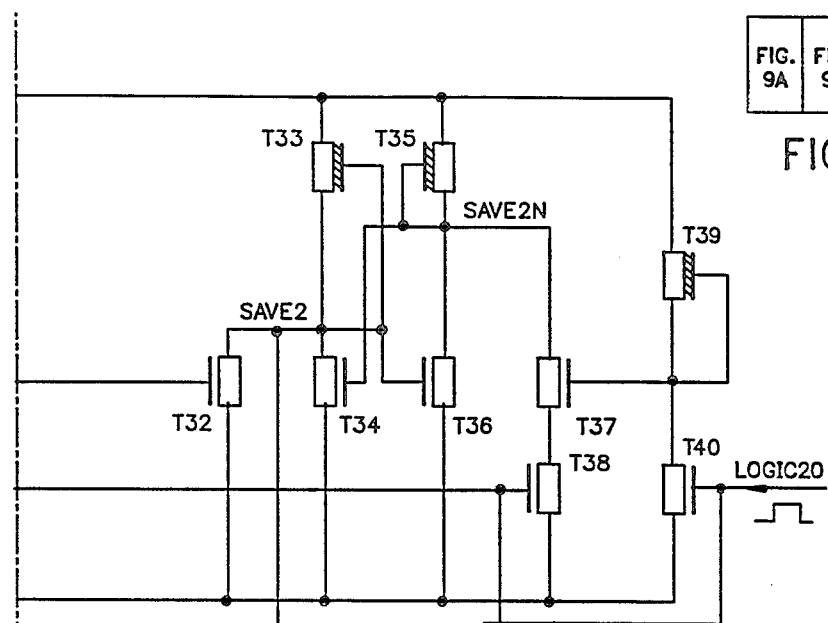
Figure 9C:
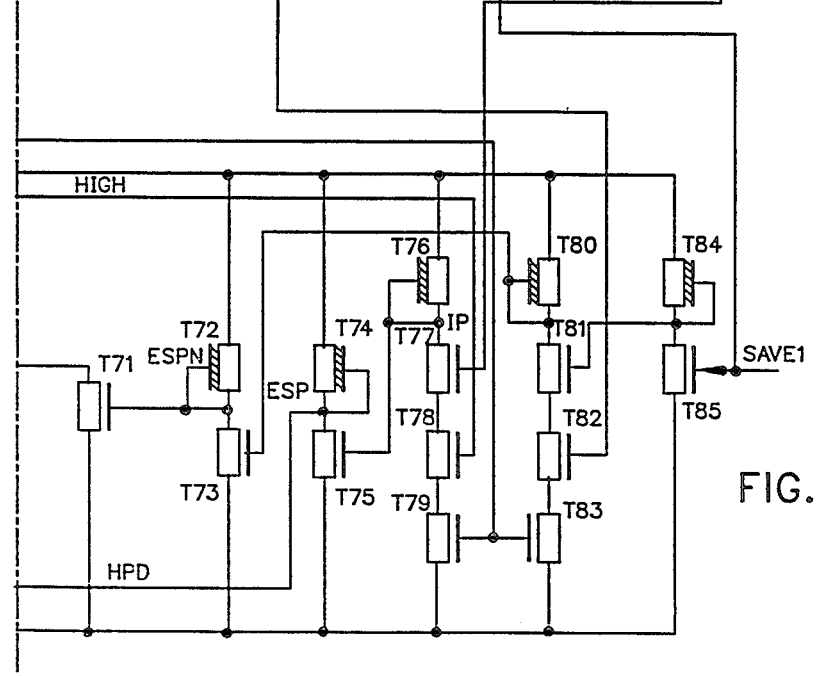

FIGS. 8A and 8B show a circuit diagram and a timing diagram for counter 2''' (FIG. 3). The function of the counter circuit is to generate a reset pulse labeled LNL (FIGS. 3 and 8A). The pulse is used to reset the previously described capacitors sitting on the front end of the 20 V sense amplifier (FIG. 3). The pulse is formed from two oscillator pulses in duration. The counter is comprised of three latches formed from devices Latch 1: T1-T8, T11, T28
Latch 2: T14-T20
Latch 3: T21-T27

The state of the counter is dependent on the oscillator. The oscillator in turn is activated by the rise of the signal labeled Save1.

Still referring to FIGS. 8A and 8B, node LNL, Countl and NTOL are held low during volatile operation by devices T11, T20 and T27. The oscillator output nodes are allowed to float high when they are inactive. The rise of the signal labeled Save1 enables device T1 and shuts off the devices holding the three latches in their initial states. The falling edge of the oscillator output makes the signal labeled OSCN rise. As a result, device T2 is turned on and pulls the source electrode of device T3 to ground, causing LNL to go high. The signals on the lines labeled Count 1 and TOL remain low. With the next rising edge of the oscillator output the current path is established through devices T14 and T15. As a result, the node labeled Count N is pulled to ground while the node labeled Count 1 rises. The subsequent falling of the oscillator signal enables the current path through devices T21 and T22. This causes the signal TOL to rise. Thus, when the oscillator comes high again, the current path through devices T7 and T8 pulls the line labeled LNL back down, ending the resetting of the capacitor.

Reset Delay Sense Circuit

Figure 7:
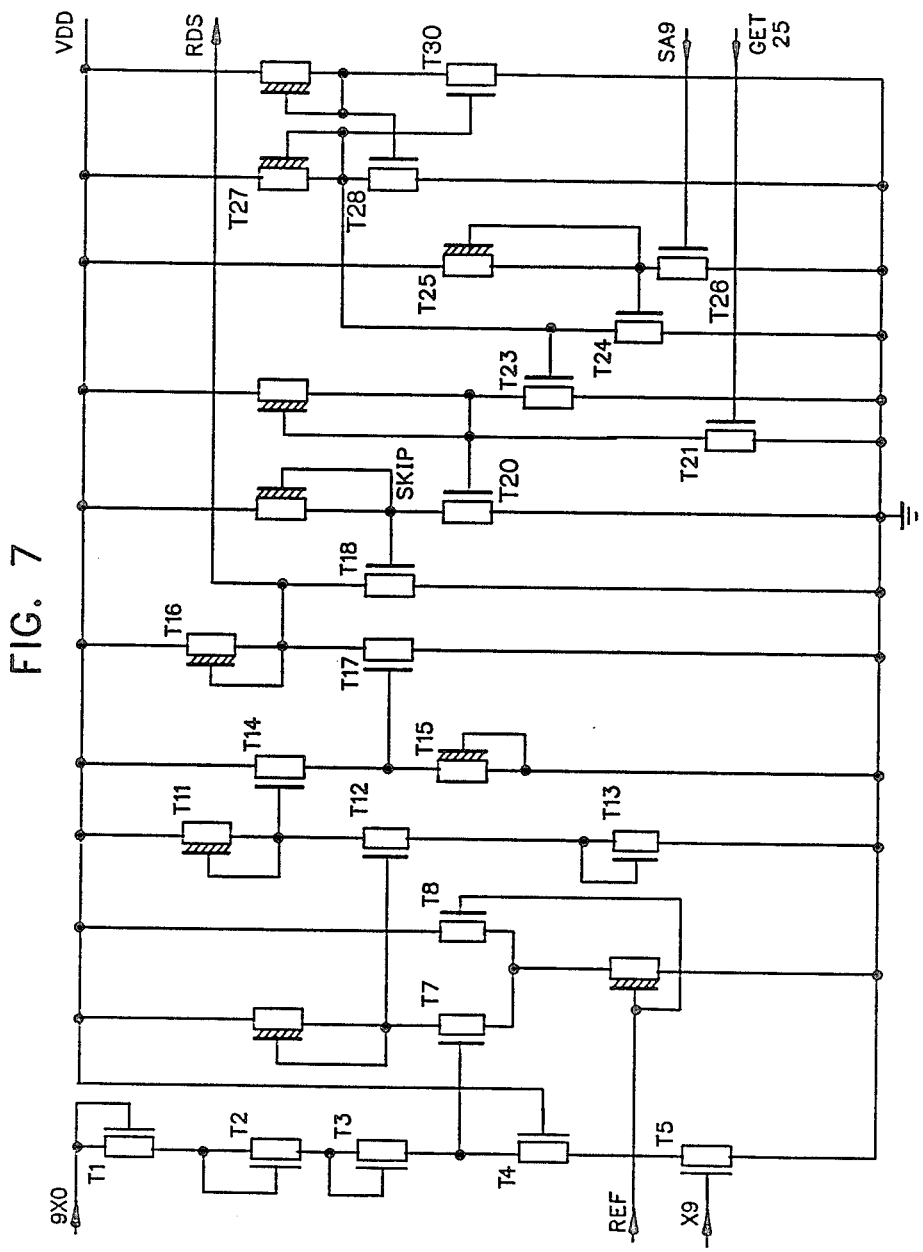
FIG. 7 shows a circuit diagram of a reset delay sense circuit.

FIG. 7 shows a circuit schematic for the reset delay sense circuit (FIG. 3). The purpose of this circuit allows the sense amplifier to be ignored much of the reset time, thus giving less false output. The 9 V sense amplifier gives a temporary erroneous command to pump during the resetting of the switch capacitors since the input of the sense amplifier is grounded. The skip signal is generated by a latch to deactivate the reset delay sense signal during power up to allow the oscillator to pump to +9 V level.

The switched capacitor reset signal labeled as X9 (FIG. 7) drains the diode string of T1-T3 while the signal on the line labeled 9X0 is falling. This pulls the input to device C7 low which enables device T6 to charge up its source which is the gate of device T12. Following this, the gate of device T14 falls, as does the gate of device T17. As a result, RDS goes high. It should be noted that after X9 falls, there is a noticeable delay before 9X0 is completely recharged. Devices T7-T9 form a differential amplifier which is biased so that when signal 9X0 reaches approximately +7.5 V, the output will change state. Devices T19-T30 form a latch circuit which is heavily biased and powers up in a predetermined state. The latch changes state only after the sense amplifier indicates that the control gate has been pumped to +9 V. This latch output is ORed with the signal Get25, giving skip signal.

After power/up, Skip is high only while Get25 is high. This effectively ignores the signal RDS while the control gate is at ground or on its way back up at the end of a get cycle.

Timer Circuit

Figure 6:
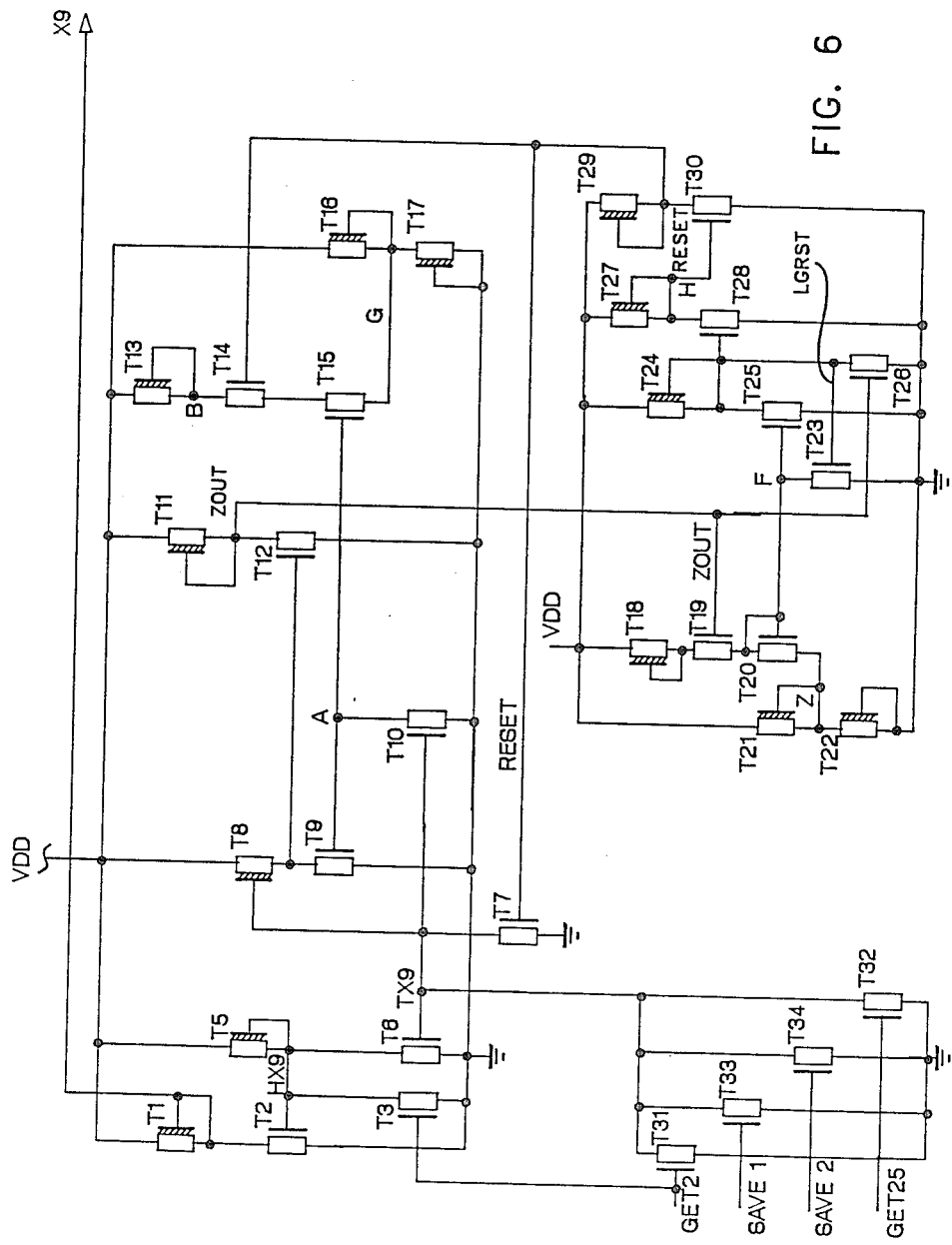
FIG. 6 shows a circuit diagram for a timer.

FIG. 6 shows a circuit schematic for timer 1''' (FIG. 3). The circuit provides a controlled reset pulse for resetting the capacitors located on the leading end of the 9 V sense amplifier circuit. As stated previously, the NVRAM has two modes of operation. During volatile operation, the control gate of the NVRAM must be maintained at +9 V. A sense circuit monitors this voltage through a capacitor divider network. To maintain an accurate sense level the timer circuit provides a periodic reset signal to the capacitor divider network. If the reset pulse is present too often or lasts too long, an amount of charge is drained from the control gate. On the other hand, the pulse duration must be sufficient to reset the capacitors and frequent enough to negate leakage from the control gate. The timer circuit is turned off during non-volatile operation by one or more of devices T31-T34. As a result, node labeled TX9 is pulled to ground. As soon as these pull down devices are disabled, node TX9 begins to charge through device T8. When node TX9 reaches a threshold voltage, device T10 turns on and pulls node A firmly to ground. The rise of node TX9 causes node ZOUT to fall, disabling the current path through device T9 and permitting the charge on node F to decay through device T20 and T22. When node F reaches a threshold voltage, device T25 turns off, allowing the node labeled LGRFT to rise, enabling a current path through device T23. This pulls node F to ground. After LGRFT rises, the signal labeled RESET goes high grounding TX9, charging node A, ending the up time of TX9. Node A decays more slowly than node F, causing the delay between pulses to be longer than the up time. Node X9 follows node TX9 except during Get2 when X9 is held high. Node X9 is a timer output for the reset of the control gate circuitry.

The small leakage currents which are necessary for longest charge times are generated by biasing the gates of devices T15 and T20 slightly above the threshold voltage. The difference in discharge times between node A and node F is caused by the different bias voltages set up by devices T16, T17, T21 and T22. Node F is biased near the threshold voltage (Vth) of device T25 and thus provides a short delay whereas node A is biased further above the Vth of device T9, thus giving a longer delay time. The comparatively long delay is due to small current through a long device whose Vgs is barely above its Vth. Since Id is proportional to Vgs−Vth, in each case near the end of the discharge cycle the current through T20 or T15 becomes quite small. With each voltage decrement, the current decreases exponentially.

Operation

The NVRAM operates in a volatile and non-volatile mode. During volatile operation, the RAM plane is freed for use. A potential of +9 V is maintained on the control gate which causes a depletion well under the control gate. The control gate voltage is sampled periodically and compared with a reference level. If the result is less than the required 9 V, oscillator/charge pump system 26 (FIG. 3) is activated to increase the voltage on the control gate. Timer circuit 1''' (FIG. 3) runs during normal volatile operation. It resets the 9 V capacitor network periodically. This allows accurate monitoring of the voltage on the control gate. The timer is deactivated during non-volatile operation. Due to the grounding of the input to the sense amplifier, it gives a temporary erroneous command to pump during the resetting of the +9 V switch capacitors. The reset delay sense (RDS) 28'' (FIG. 3) causes the sense amplifier to be ignored during much of the reset time, thereby giving a smaller false output. A differential amplifier in the RDS circuit is biased so that when the sense node reaches approximately +5 V, the output changes state. Thus, when the input to RDS is below the +5 V range, the output of the +9 V sense amplifier is ignored.

During non-volatile operation the RAM plane is unavailable for use for normal RAM operations. At the start of a save cycle, the signal Save1 is received by interface logic circuit means 28' (FIG. 3) which generates the ILCG signal and turns on the charge pump oscillator. The oscillator (FIG. 3) pumps the charge pump to +20 V. Simultaneously, Save1 signal enables counter 2''' to count 1.5 cycles of the oscillator which resets the capacitor divider network on the front end of the +20 V sense amplifier circuit. The oscillator is then turned off when the control gate voltage is sensed at +20 V. The +20 V on the control gate establishes the requisite high fields on the DEIS injectors of the floating gate so that charge is removed from or added to floating gates. This charge transfer performs the non-volatile storage operation. At the end of the save cycle, the control gate is discharged via powerdown circuit means 32 and is halted at +9 V to resume normal volatile operation.

The control gate is discharged to 0 V at the start of a get cycle via the powerdown circuit means. The low voltage sense circuit means (FIG. 3) signals the Get25-/Save3 logic circuit means 28''' when the control gate is completely discharged. The signal Get25 goes high which allows the RAM plane to retrieve data from the floating gate. The Get25/Save3 logic circuit means generates two signals, Get25 and Save3. The OR'ed value of these two signals indicate to the RAM plane that the required voltages for non-volatile operation are being generated. The Get25 signal is also sent to the RDS circuit and the timer to signal the end of the get cycle. Get25 is high until the control gate is returned to +9 V. The fall of Get2 causes ILCG to rise, thus turning on the charge pump oscillator which pumps until the +9 V sense amplifier detects a proper level on the control gate. Once +9 V is reached, signal SA9 resets the latch in the ILCG circuit and causes ILCG to go low and turns off the pump. The control gate is then maintained at the +9 V level for volatile operation.

Over/under voltage detection circuit means 28'''' (FIG. 3) generates the NORMAL, signal which is high when the power supply, Vdd, is within the normal operating range. The NORMAL signal goes low if Vdd rises too high or falls too low. The signal normally is supplied to the interfacing logic circuit to enable normal charge pump operations. When NORMAL is low, the charge pump is disabled. If an overvoltage condition occurs at the start of a non-volatile save operation, the save is aborted and the control gate is brought low via the powerdown circuit. If an undervoltage condition occurs, the control gate is powered down to prevent writing erroneous data.

While the invention has been particularly shown and described with reference to a preferred embodiment hereof, it will be understood by those skilled in the art that various changes in form and details may be made therein without departing from the spirit and scope of the present invention.

Having thus described our invention, what we claim and desire to secure as Letters Patent is as follows:

1. An on-chip multi-level voltage generating system comprising:

a charge pump circuit means having at least one drive input connected to a low voltage power supply and having an output for supplying multiple voltages;

a plurality of selectable feedback paths connected to the output of said charge pump circuit means with each feedback path controlling the charge pump circuit means to output a selected voltage level; and a control means coupled to a drive input of the charge pump and in series with each feedback path; said control means responsive to enabling signals to activate the feedback path corresponding to the selected voltage level.

2. The on-chip multi-level voltage generating system of claim 1 further including a powerdown circuit means coupling the output of said charge pump circuit means with the control means and operable when activated to provide an electrical discharge path between the output of said charge pump and a reference potential.

3. The on-chip multi-level voltage generating system of claim 1 wherein each feedback path includes a voltage regulating means; a timer circuit for periodically resetting the voltage regulating means and a sensing circuit means for sensing a voltage on the voltage regulating means.

4. The on-chip multi-level voltage generating system of claim 3 wherein the voltage regulating means includes a series connected string of capacitors.

5. The on-chip multi-level voltage generating system of claim 4 wherein the sensing circuit means includes a differential amplifier having one input connected to a reference node and one input connected to the voltage to be sensed; and circuit means connected to the reference node and operable for adjusting a voltage on said node to compensate for power supply variation.

6. The on-chip multi-level voltage generating system of claim 1 wherein the control means includes an overvoltage/undervoltage detection network having an input connected to the low voltage power supply and outputs for supplying signals representative of the state of the power supply;

an interface logic circuit means responsive to an output signal from said overvoltage/undervoltage network and to generate control signals for enabling/disabling the charge pump;

a reset delay sense circuit having an output connected to the interface logic circuit means and an input; and a get25/save3 logic circuit means connected to the input of the reset delay, sense circuit and operable to generate and output signals representative of the voltage on the output of said charge pump.

7. The on-chip multi-level voltage generating system of claim 2 wherein the powerdown circuit means includes a plurality of FET devices connected in series with each device having a gate electrode;

a chain of series connected devices connected to the gate electrode of each FET device; and means for clamping the gate electrode of each FET device to the low power supply.

8. The on-chip multi-level voltage generating system of claim 1 further including a capacitive means connected to the output of the charge pump circuit means.

* * * * *